US006940583B2

United States Patent
Butt et al.

(10) Patent No.: US 6,940,583 B2
(45) Date of Patent: Sep. 6, 2005

(54) METHOD AND APPARATUS FOR AMPLITUDE FILTERING IN THE FREQUENCY PLANE OF A LITHOGRAPHIC PROJECTION SYSTEM

(75) Inventors: Shahid Butt, Ossining, NY (US); Martin Burkhardt, White Plains, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 136 days.

(21) Appl. No.: 10/604,519

(22) Filed: Jul. 28, 2003

(65) Prior Publication Data

US 2005/0024618 A1 Feb. 3, 2005

(51) Int. Cl.$^7$ .................. G03B 27/42; G03B 27/72; G03B 27/32; G03C 5/04; G02B 27/44
(52) U.S. Cl. ..................... 355/53; 71/77; 430/396; 359/563
(58) Field of Search .................. 355/53, 67, 71, 355/77; 430/311, 396; 359/563

(56) References Cited

U.S. PATENT DOCUMENTS 4,947,413 A * 8/1990 Jewell et al. .................. 378/34
5,703,675 A * 12/1997 Hirukawa et al. ............ 355/53
5,863,712 A    1/1999 Von Bunau et al.

OTHER PUBLICATIONS

"Characterization of Super–Resolution Photolithography", H. Fukuda, R. Yamanaka, T. Terasawa, K, Hama, T. Tawa and S. Okazaki, IEEE, Apr. 1992, pp. 3.2.1–3.2.4.

"Resolution Enhancement by Oblique Illumination Optical Lithography Using a Pupil Filter", T. Horiuchi, Y. Takeuchi, S. Matsuo and K. Harada, IEEE, 1993, pp. 27.3.1–27.3.4.

* cited by examiner

*Primary Examiner*—Alan Mathews
(74) *Attorney, Agent, or Firm*—DeLio & Peterson, LLC; Peter W. Peterson; Todd M. C. Li

(57) ABSTRACT

A method of projecting a pattern from a mask onto a substrate comprises providing an energy source, a substrate, and a mask containing a pattern of features to be projected onto the substrate, and projecting an energy beam from the energy source though the mask toward the substrate to create a projected mask pattern image. The projected mask pattern image is created by zeroth and higher orders of the energy beam. The method then includes diffracting zeroth order beams of the projected mask pattern image to an extent that prevents the zeroth order beams from reaching the substrate, while permitting higher order beams of the projected mask pattern image to reach the substrate. Preferably, the zeroth order beams of the projected mask pattern image are diffracted at an obtuse angle.

20 Claims, 4 Drawing Sheets

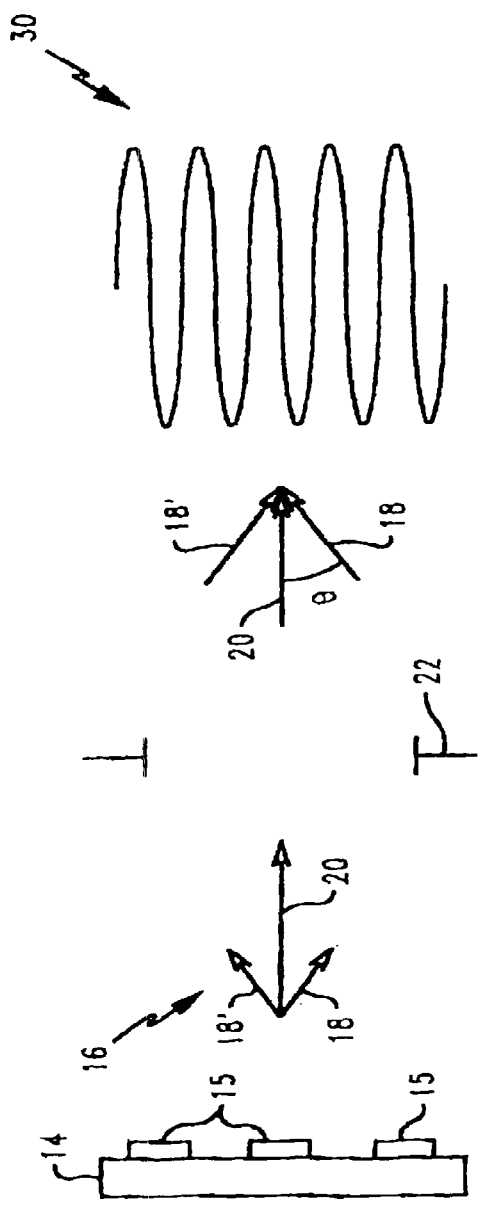
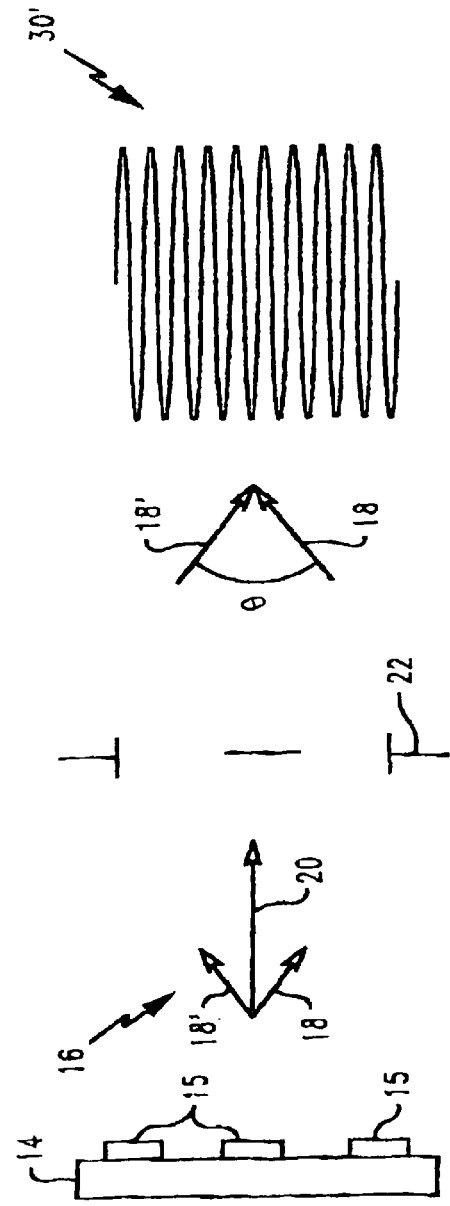
FIG. 3a
FIG. 3b

METHOD AND APPARATUS FOR AMPLITUDE FILTERING IN THE FREQUENCY PLANE OF A LITHOGRAPHIC PROJECTION SYSTEM

BACKGROUND OF INVENTION

The present invention relates to a method and apparatus for projecting a pattern from a mask onto a substrate in the lithographic production of microelectronic features and, in particular, to a method and apparatus which filters amplitude in the frequency plane of the projected image.

Because of the need to decrease size of microelectronic circuits and other features lithographically produced on semiconductor wafers, there has been considerable effort made to increase the resolution of the image projected onto the substrate from the mask containing the image pattern. Some work has been done to modify the phase of the light beam as it passes through the mask, and other work has been done to modify the amplitude of the energy beam containing the projected mask pattern image. As shown in FIG. 1A in an illustration of a typical prior art projection system, also called a stepper, an illumination source 10 projects an energy beam 12 through a mask 14 containing a pattern of the features to be formed on a wafer substrate. The projected mask pattern image 16 contains zeroth order beam 20, and first order beams 18 and 18', as well as any other higher order beams which may have been created during mask transmission. As the projected image pattern passes through pupil plane opening 22 in a projection lens system, the different orders of energy beams are essentially unaffected so that the zeroth, first and higher orders in the projected mask pattern strike the image plane 24 on the surface of the wafer substrate. The interference of the beams then creates the desired image of the mask.

A previous attempt to modify amplitude of the zeroth diffracted order of the projected image pattern 16 and obtain a higher resolution is shown in FIG. 1B, wherein an opaque filter 26 is placed in pupil plane 22 to absorb zeroth order beam 20. This results in only the first order beams 18, 18' and any higher order beams striking the image plane 24. As a consequence of the blocked zeroth order, the pitch of the image is doubled, as would happen with an alternating phase shifting mask. This method works well and has been confirmed in experiments before. However, introduction of the filter in tools has been hindered by the fact that an opaque filter absorbs energy and gets heated. The result of this is that the surrounding optical materials, such as glass, through which the light passes are heated to such an extent that the index of refraction is changed sufficiently to affect the imaging characteristics of the projection system, causing undesirable aberrations. Thus, there is a considerable problem in jeopardizing the optical performance of the scanning tool which projects the mask pattern image onto the wafer substrate. Accordingly, there is a need to improve resolution of the mask pattern image without affecting the optical characteristics of the scanning tool.

SUMMARY OF INVENTION

Bearing in mind the problems and deficiencies of the prior art, it is an object of the present invention to provide a method and apparatus for projecting a mask pattern image in a photolithography tool which increases resolution of the image, without resorting to a phase shifting mask.

It is another object to provide a method and apparatus of modifying the amplitude of a selected diffracted order of a mask pattern without causing a heating of the area in the vicinity of the projection lens system.

It is another object to provide a method and apparatus for preventing a selected order of the energy of the projected mask pattern image beam from reaching the image plane of the substrate.

The above and other objects, which will be apparent to those skilled in art, are achieved in the present invention which is directed to a method of projecting a pattern from a mask onto a substrate in the lithographic production of microelectronic features comprising initially projecting a pattern from a mask toward an image plane of a substrate using an illuminating energy beam, wherein the pattern being projected from the mask has zeroth and higher orders of the energy beam. The method then includes deflecting one or more of the orders of energy beams of the projected mask pattern at an obtuse angle to prevent the one or more deflected order beams from reaching the image plane, while permitting at least one order of the beams of the projected pattern to reach the image plane and form the projected pattern on the substrate.

Preferably, the zeroth order beams of the projected mask pattern are deflected, and higher order beams of the mask pattern reach the image plane and form the projected pattern on the substrate. More preferably, the zeroth order beams of the projected pattern are diffracted by a diffraction grating. Normally, the projected mask pattern contains first orders of the energy beam, so that the first order beams of the projected pattern reach the image plane. As a result, the projected mask pattern on the image plane has a smaller pitch, compared to a projected mask pattern containing zeroth order beams of the projected mask pattern. Also, the projected mask pattern on the image plane has decreased amplitude, compared to a projected mask pattern containing zeroth order beams of the projected mask pattern. In the method of the invention, the zeroth order beams of the projected pattern are deflected without heating surrounding optical material through which beams of the projected mask pattern pass and changing index of refraction of the optical material to an extent that affects the projected mask pattern.

In another aspect, the present invention is directed to a method of projecting a pattern from a mask onto a substrate comprising providing an energy source, a substrate, and a mask containing a pattern of features to be projected onto the substrate, and projecting an energy beam from the energy source though the mask toward the substrate to create a projected mask pattern image. The projected mask pattern image is created by zeroth and higher orders of the energy beam. The method then includes diffracting zeroth order beams of the projected mask pattern image to an extent that prevents the zeroth order beams from reaching the substrate, while permitting higher order beams of the projected mask pattern image to reach the substrate. Preferably, the zeroth order beams of the projected mask pattern image are diffracted at an obtuse angle.

A related aspect of the invention is directed to an apparatus for projecting a pattern from a mask onto a substrate in the lithographic production of microelectronic features comprising a mask having a pattern thereon and illumination source for projecting an energy beam to illuminate the mask and projecting the pattern onto an image plane of a substrate, wherein the pattern projected from the mask has zeroth and higher orders of the energy beam. The apparatus also includes a pupil filter for modifying the projected mask pattern. The pupil filter includes an optical element adapted to deflect one or more of the orders of energy beams of the projected pattern at an obtuse angle to prevent the one or more deflected order beams from reaching the image plane, while permitting at least one order of the beams of the projected pattern to reach the image plane and form the projected pattern on the substrate.

Preferably, the optical element is adapted to deflect the zeroth order beams of the projected mask pattern, and permit higher order beams of the mask pattern to reach the image plane and form the projected pattern on the substrate. More preferably, the optical element is a diffractive element adapted to diffract zeroth order beams of the projected pattern at an obtuse angle. The diffractive element diffracts zeroth order beams of the projected mask pattern image without heating surrounding optical material through which beams of the projected mask pattern image pass and changing index of refraction of the optical material to an extent that affects the projected mask pattern image.

The apparatus may further including a condenser lens between the illumination source and the mask and a workpiece holder for the substrate. The pupil filter is part of a projector lens system for projecting the mask pattern to reach the image plane and form the projected pattern on the substrate.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 3A and 3B show, respectively, the effect of permitting passage of, and eliminating passage of, the zeroth order beam on the pitch of the projected mask pattern image. Because the zeroth order is missing, the pitch is doubled in FIG. 3B.

DETAILED DESCRIPTION

In describing the preferred embodiment of the present invention, reference will be made herein to FIGS. 1–4 of the drawings in which like numerals refer to like features of the invention.

Figure 2:
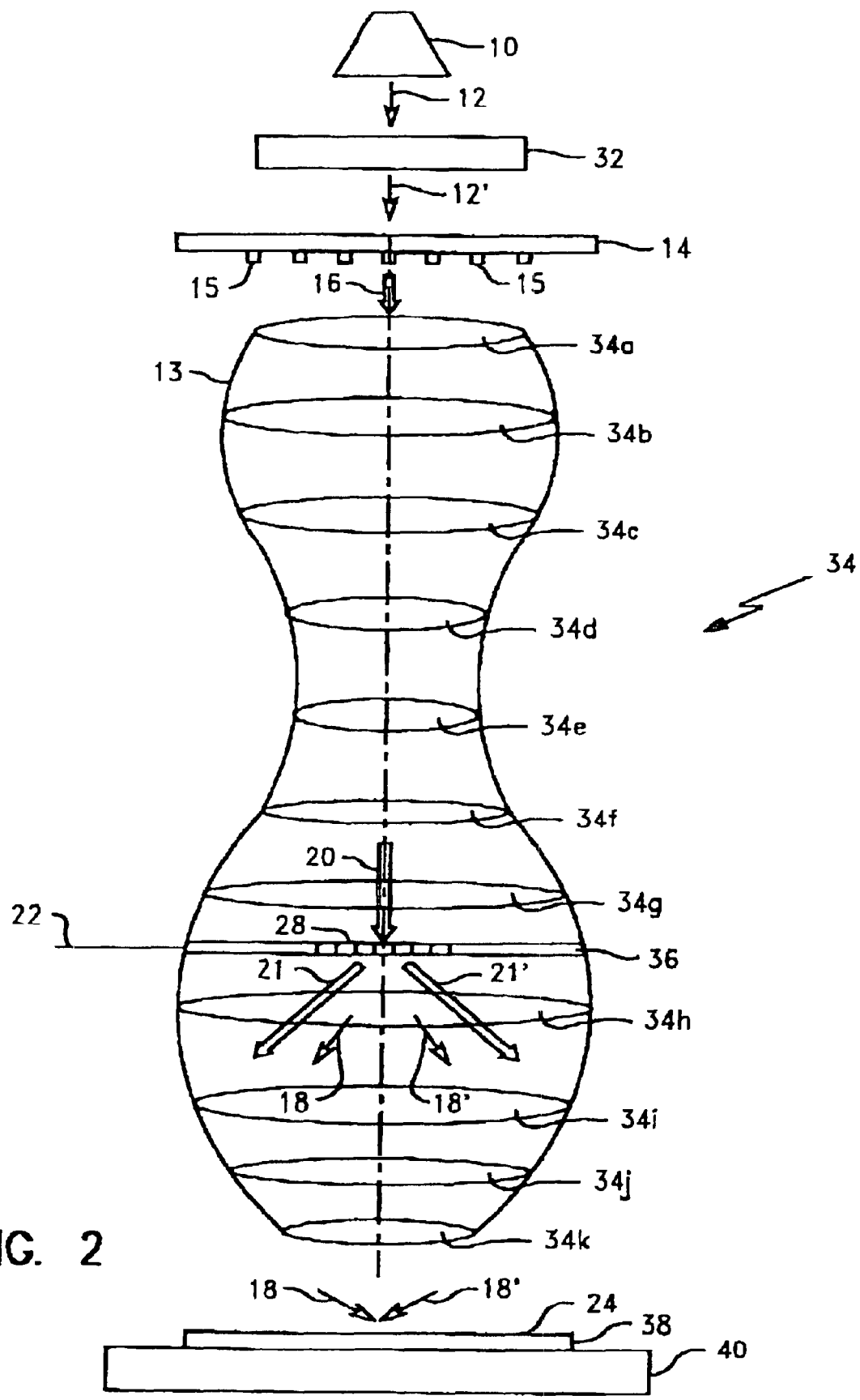
FIG. 2 is a schematic, elevational view of the preferred projection system of the present invention, showing positive lenses only.

A schematic of the preferred projection system, or stepper, of the present invention is depicted in FIG. 2. Illumination source 10 emits light or other energy beam 12, which travels through a condenser lens 32 and onward as beam 12', through mask 14. Disposed on mask 14 is a mask pattern made up of elements 15 configured to the pattern of the microelectronic circuit elements or other features which are to be lithographically produced on the surface of wafer substrate 38. Wafer substrate 38 is mounted on a workpiece support or stage 40 which moves the wafer as the mask 14 patterns 15 are repeatedly projected onto the image plane of 24 on the surface of the wafer, which contains a resist layer that reacts to the projected pattern. A projection lens system 34 comprises, in sequence, a series of lenses 34a–g, pupil 36 mounted along pupil plane 22 and a further series of projection lenses 34h–34k. Only positive lenses are shown; the projector system would also contain negative lenses. Typically, the system contains more than 30 lens elements. The energy beam 16 emerging from mask 14 contains the projected mask pattern aerial image in the first order beams 18, 18' and higher order beams (not shown).

Figure 1A:
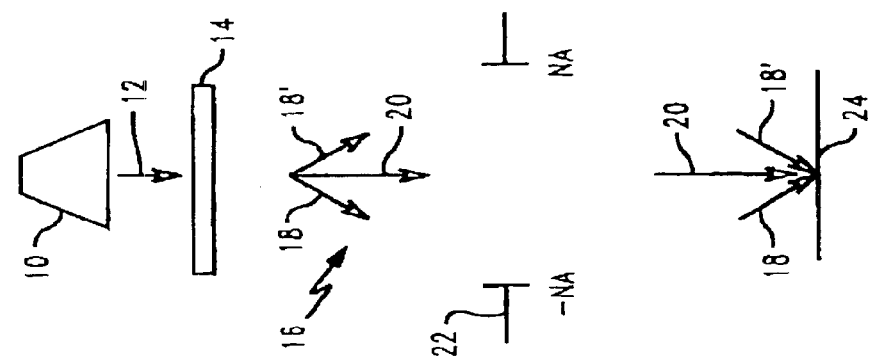
FIGS. 1A and 1B illustrate, in schematic elevational views, prior art mask pattern projection systems.
Figure 1B:
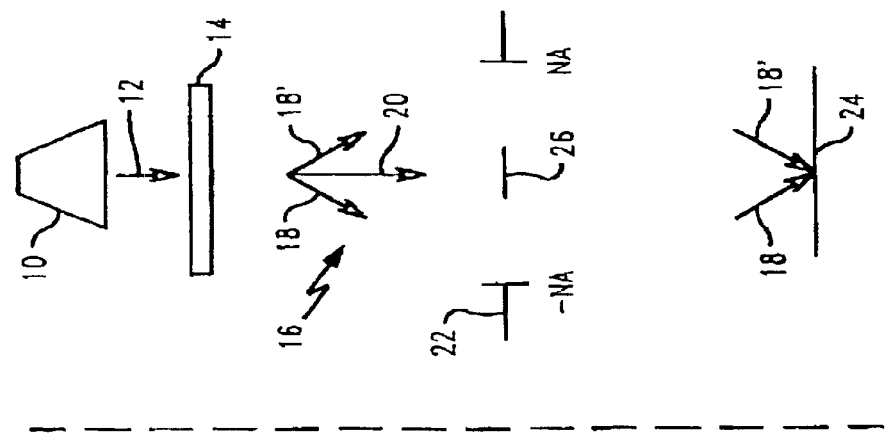
Figure 1C:
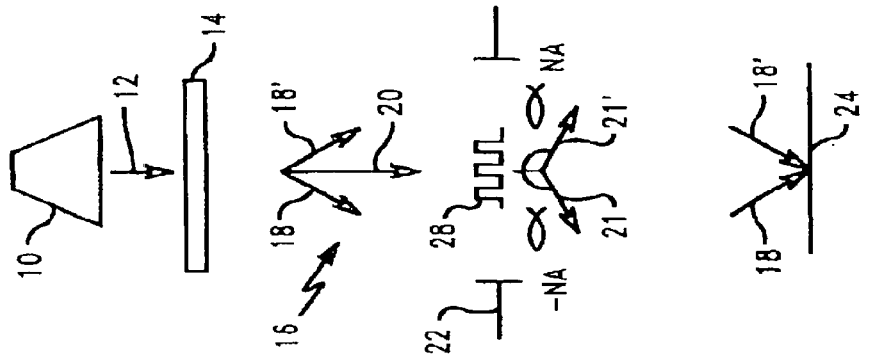
FIG. 1C is a schematic, elevational view of the preferred method and apparatus of the present invention showing the deflection of zeroth order beams of the projected mask pattern, in the pupil, so that it does not reach the substrate.

As shown in FIG. 1C, which depicts in schematic form the manipulation of the projected mask pattern in accordance with the present invention, projected mask pattern image 16 contains both zeroth order beams 20 as well as first order beams 18 and 18' and higher order beams. Pupil 36, located along pupil plane 22, contains a pupil filter comprising an optical element 28 that deflects only the zeroth order beams of the projected mask pattern image to a degree such that they do not strike the image plane 24 on wafer 38. As shown in FIGS. 1C and 2, the preferred optical element 28 is a diffractive optical element, also referred to as a diffraction or transmission grating, which has sufficiently small pitch to diffract the zeroth order beam 20 into beams 21 and 21', which are then emitted from the optical element at an obtuse angle α, i.e., is greater than 90°, with respect to the original direction of zeroth beam 20. The angle of deflection of the diffracted zeroth order beams 21, 21' is dependent on the pitch of the grating on diffractive optical element 28, as well as the wavelength of the energy beam. Thus, for a given beam wavelength of the projection system, the grating pitch of optical element 28 may be varied to obtain the desired scattering of zeroth order beams 21, 21'. Such optical element may be constructed for the particular requirements of the projection system by one skilled in the art without undue experimentation.

Optical element 28 deflects beams 21, 21' at an angle such that they do not reach the point of projection of the remaining projected mask pattern image. Instead, the remaining mask pattern image which is focused by projector lens system 34 onto image plane 24 is made up of the unaffected first order beams 18, 18' and any higher order beams. Thus optical element 28 does not absorb zeroth order beam 20 of the projected mask pattern image, as was done in prior art by use of an opaque filter, but instead deflects the zeroth order beam through and beyond the pupil and scatters it away from the remaining projected mask pattern image. Thus the present invention filters and reduces the amplitude of the mask pattern image in the pupil or frequency plane as it passes through the pupil. Since the zeroth order beam is scattered and not absorbed, the diffraction grating of the present invention does not heat up and therefore does not cause any changes to the index of refraction of the optical material in the vicinity of the pupil, as in the prior art. Baffles (not shown) may be provided to suppress the stray beams 21, 21'.

While the preferred embodiment of the present invention deflects zeroth order beams, and permits first and higher order beams to project onto the wafer, optical element 28 may diffract or otherwise deflect one or more other orders of beams, and permit at least one order of the remaining, non-deflected beams to reach the wafer. For example, the removal of a non-zeroth order beam may improve imaging in, for example, two-dimensional patterns. As alternatives to the preferred diffraction grating, the optical element may also comprise one or more suitable refracting or reflecting optical elements that deflect one or more of the orders.

The improvement in resolution as a result of the present invention is shown in the comparison of projected mask images in FIGS. 3A and 3B. In FIG. 3A the projected pattern image 16 emitted by passage of the energy beam through mask 14 is received at the image plane with a pitch 30, which is a function of the sine of the angle Θ between adjacent zeroth and first order beams 20, and 18, 18', as well as the wavelength λ of the energy beam. The improvement in accordance with the present invention is depicted in FIG. 3B, where as a result of the absence of zeroth order beam 20, the angle of theta between first order beams 18 and 18' is larger and the pitch of the imaged pattern 30' is therefore smaller. This essentially reduces the theoretical pitch of the image pattern in half. While the pitch can be improved through other means, for example, the use of a prior art alternating phase shift mask, the present invention enables one to achieve this level of resolution enhancement without the use of the expensive mask technology.

Figure 4:
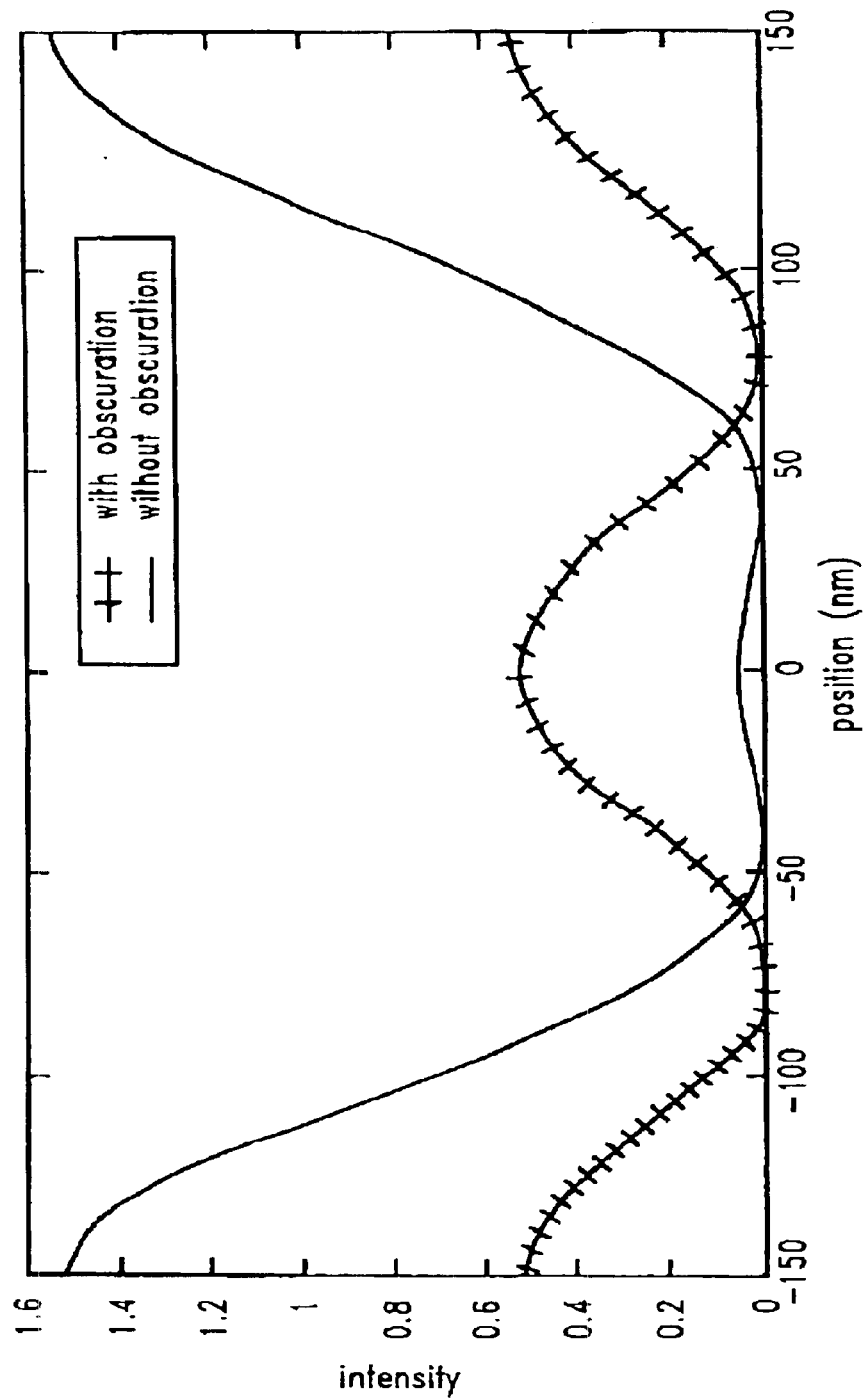
FIG. 4 is a graphical comparison of the aerial image of the two systems of FIGS. 3A and 3B.

A simulated comparison of the lithographic performance of a mask pattern with and without the present invention is depicted in FIG. 4, showing the aerial image of the two systems of FIGS. 3A and 3B. The graph shows the aerial image in the wafer plane for the case of three orders contributing to the image, i.e., without obscuration by pupil filter 28, and the case of two orders contributing to the imaging, i.e., with obscuration by pupil filter 28 as described above. In the case of two orders, the pitch of the image is half the pitch of the image produced with three orders.

Accordingly, the present invention provides for improved resolution of projected mask pattern images in lithographic production of microelectronic features through filtering of zeroth order energy beams, which results in amplitude filtering of the energy beam without changing its phase. This may replace phase shifting masks.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of projecting a pattern from a mask onto a substrate in the lithographic production of microelectronic features comprising:
   projecting a pattern from a mask toward an image plane of a substrate using an illuminating energy beam, the pattern projected from the mask having zeroth and higher orders of the energy beam; and
   deflecting one or more of the orders of energy beams of the projected mask pattern at an obtuse angle to prevent the one or more deflected order beams from reaching the image plane, while permitting at least one order of the beams of the projected pattern to reach the image plane and form the projected pattern on the substrate.

2. The method of claim 1 wherein the zeroth order beams of the projected mask pattern are deflected, and higher order beams of the mask pattern reach the image plane and form the projected pattern on the substrate.

3. The method of claim 1 wherein zeroth order beams of the projected pattern are diffracted at an obtuse angle.

4. The method of claim 1 wherein the projected mask pattern contains first orders of the energy beam, and wherein the first order beams of the projected pattern reach the image plane.

5. The method of claim 1 wherein the projected mask pattern on the image plane has a smaller pitch, compared to a projected mask pattern containing zeroth order beams of the projected mask pattern.

6. The method of claim 1 wherein the zeroth order beams of the projected mask pattern are deflected, and the projected mask pattern on the image plane has decreased amplitude, compared to a projected mask pattern containing zeroth order beams of the projected mask pattern.

7. The method of claim 1 wherein zeroth order beams of the projected pattern are deflected without heating surrounding optical material through which beams of the projected mask pattern pass and changing index of refraction of the optical material to an extent that affects the projected mask pattern.

8. A method of projecting a pattern from a mask onto a substrate comprising:
   providing an energy source, a substrate, and a mask containing a pattern of features to be projected onto the substrate;
   projecting an energy beam from the energy source though the mask toward the substrate to create a projected mask pattern image, the projected mask pattern image being created by zeroth and higher orders of the energy beam; and
   diffracting zeroth order beams of the projected mask pattern image to an extent that prevents the zeroth order beams from reaching the substrate, while permitting higher order beams of the projected mask pattern image to reach the substrate.

9. The method of claim 8 wherein the zeroth order beams of the projected mask pattern image are diffracted at an obtuse angle.

10. The method of claim 9 wherein the projected mask pattern image contains first orders of the energy beam, and wherein the first order beams of the projected mask pattern image reach the substrate.

11. The method of claim 10 wherein the projected mask pattern image on the substrate has a smaller pitch, compared to a projected mask pattern image containing zeroth order beams.

12. The method of claim 10 wherein the projected mask pattern image on the substrate has decreased amplitude, compared to a projected mask pattern image containing zeroth order beams.

13. The method of claim 12 wherein the zeroth order beams of the projected mask pattern image are diffracted without heating surrounding optical material through which beams of the projected mask pattern image pass and changing index of refraction of the optical material to an extent that affects the projected mask pattern image.

14. An apparatus for projecting a pattern from a mask onto a substrate in the lithographic production of microelectronic features comprising:
   a mask having a pattern thereon;
   illumination source for projecting an energy beam to illuminate the mask and projecting the pattern onto an image plane of a substrate, the pattern projected from the mask having zeroth and higher orders of the energy beam;
   a pupil filter for modifying the projected mask pattern, the pupil filter having an optical element adapted to deflect one or more of the orders of energy beams of the projected pattern at an obtuse angle to prevent the one or more deflected order beams from reaching the image plane, while permitting at least one order of the beams of the projected pattern to reach the image plane and form the projected pattern on the substrate.

15. The apparatus of claim 14 wherein the optical element is adapted to deflect the zeroth order beams of the projected mask pattern, and permit higher order beams of the mask pattern to reach the image plane and form the projected pattern on the substrate.

16. The apparatus of claim 14 wherein the optical element is a diffractive element adapted to diffract zeroth order beams of the projected pattern at an obtuse angle.

17. The apparatus of claim 14 wherein the diffractive element is adapted to diffract zeroth order beams of the projected mask pattern image without heating surrounding optical material through which beams of the projected mask pattern image pass and changing index of refraction of the optical material to an extent that affects the projected mask pattern image.

18. The apparatus of claim 14 further including a condenser lens between the illumination source and the mask and a workpiece holder for the substrate, and wherein the pupil filter is part of a projector lens system for projecting the mask pattern to reach the image plane and form the projected pattern on the substrate.

19. The apparatus of claim 18 wherein the optical element is a diffractive element adapted to diffract zeroth order beams of the projected pattern.

20. The apparatus of claim 19 wherein the diffractive element is adapted to diffract zeroth order beams of the projected mask pattern image without heating surrounding optical material through which beams of the projected mask pattern image pass and changing index of refraction of the optical material to an extent that affects the projected mask pattern image.

* * * * *